United States Patent [19]
Aiyer

[11] Patent Number: 5,453,814
[45] Date of Patent: Sep. 26, 1995

[54] ILLUMINATION SOURCE AND METHOD FOR MICROLITHOGRAPHY

[75] Inventor: Arun A. Aiyer, Fremont, Calif.

[73] Assignee: Nikon Precision Inc., Belmont, Calif.

[21] Appl. No.: 226,992

[22] Filed: Apr. 13, 1994

[51] Int. Cl.$^6$ .............................. G03B 27/42; G03B 27/54
[52] U.S. Cl. .................... 355/70; 355/53; 359/327
[58] Field of Search ................................ 355/53, 67, 70; 359/327

[56] References Cited

U.S. PATENT DOCUMENTS

| | | | |
|---|---|---|---|
| 4,939,630 | 7/1990 | Kikuchi et al. | 362/268 |
| 4,991,160 | 2/1991 | Premji | 369/44.12 |
| 5,048,926 | 9/1991 | Tanimoto | 359/487 |
| 5,091,744 | 2/1992 | Omata | 355/53 |
| 5,105,076 | 4/1992 | Premji | 250/201.5 |
| 5,224,200 | 6/1993 | Rasmussen et al. | 385/146 |
| 5,233,460 | 8/1993 | Partlo et al. | 359/247 |
| 5,237,367 | 8/1993 | Kudo | 355/67 |
| 5,245,384 | 9/1993 | Mori | 355/67 |
| 5,274,494 | 12/1993 | Rafanelli et al. | 359/327 |
| 5,296,892 | 3/1994 | Mori | 355/67 |
| 5,300,971 | 4/1994 | Kudo | 355/67 |
| 5,309,198 | 5/1994 | Nakagawa | 355/67 |
| 5,333,035 | 7/1994 | Shiraishi | 355/77 |
| 5,363,170 | 11/1994 | Muraki | 355/67 |
| 5,392,094 | 2/1995 | Kudo | 355/67 |

OTHER PUBLICATIONS

Turunen et al., Coherence Control by acousto–optic multifrequency Bragg Diffraction, abstract, SPIE vol. 1230 Int'l. Conf. on Optoelectronic Sci. & Eng. '90, p. 8.

Vasilev et al., Reduction of contrast of speckle structure . . ., abstract, Opt. Spectrosc. (USSR) 70(1), Jan. 1991, p. 2.

*Primary Examiner*—Richard A. Wintercorn
*Attorney, Agent, or Firm*—Bennet K. Langlotz

[57] ABSTRACT

A light source having a solid state laser emitting a beam that is separated into a number of segments. Each segment is frequency shifted by a different amount so that the segments do not substantially overlap in the frequency domain. Each segment passes through a short focal length lens element of a fly's eye array to be dispersed onto a mask plane for evenly illuminating a mask. The lens elements of the fly's eye array are contained within a small region in comparison to the width of the dispersed beam segments, such that each beam segment contributes illumination to the entirety of a common portion of the mask. The apparatus may include a beam expander to permit the frequency shifting cells to be positioned in an array entirely circumscribed by the diameter of the expanded beam, or may alternatively include an arrangement of beam splitters used to generate a branching beam path, with the branches passing through different numbers of frequency shifting cells to generate a diversity of frequencies in the resulting beam segments. A half- or quarter-wave plate may be used to shift or change the polarity of some of the beam segments, or of portions of all of the beam segments, reducing the quantity or capacity of frequency shifting cells required.

33 Claims, 4 Drawing Sheets

ILLUMINATION SOURCE AND METHOD FOR MICROLITHOGRAPHY

FIELD OF THE INVENTION

This invention relates to a method and apparatus for providing uniform illumination. More particularly, it pertains to uniform illumination of a mask embodying a pattern to be projected onto a wafer for manufacture of semiconductor chips.

BACKGROUND AND SUMMARY OF THE INVENTION

A primary objective of photo microlithography is to create images of the finest detail possible. High resolution images having extremely narrow line and space widths permit manufacture of complex integrated circuits on chips of small size.

To form a pattern on a semiconductor chip, light is transmitted through a planar mask and projected onto a planar wafer by a projection lens that generates a reduced image of the mask on the wafer. The projected image causes a chemical reaction in photo-resist material coating the wafer, such that a permanent image of the mask may be created on the wafer. Illumination of the mask plane and of the wafer plane must be uniform, avoiding both small, local variations, and broad macroscopic variations across either plane.

To increase the imaging resolution and decrease the minimum line and space widths, it has been found useful to employ a light source having a short wavelength. Illumination sources in the deep ultra-violet (DUV) range of 150 to 300 nanometers have proven suitable. Because conventional broad-band Xenon and Mercury arc lamps do not generate sufficient energy in the desired DUV range, other light sources are required.

Krypton-Fluoride (KrF) and Argon-Fluoride (ArF) gas lasers provide efficient illumination in the DUV range and are used for photo microlithography. However, such gas lasers have significant disadvantages. The poisonous nature of the required gases necessitates strict and costly safety measures, and presents a potential safety hazard. Also, gas lasers require regular maintenance during which chip manufacturing must be uneconomically suspended. Required maintenance activities include gas replacement and containment chamber maintenance due to the corrosive effects of the laser gases.

Solid-state lasers avoid the maintenance and safety concerns inherent in gas lasers, while providing sufficient illumination in the desired DUV range. However, a solid-state laser emits a beam that is spatially coherent across its entire diameter. While coherence is advantageous in other applications, it causes problems in photo microlithography. When a coherent beam is expanded or otherwise optically processed to provide even illumination of the mask, speckles or interference fringes will occur in the mask plane. Such non-uniformities are unacceptable because they generate fringes projected onto the wafer. These fringes create corresponding unevenly exposed regions on the wafer.

While an excimer is coherent only locally across small fractional diameter portions of its beam, it is incoherent on the macroscopic scale across its entire beam. The local "islands" of coherency are small, and incoherent with respect to each other. Therefore, a simple "fly's eye" array of short focal-length lenses may be placed in a gas laser beam path to disperse and average the islands of coherency to provide uniform illumination without objectionable speckles or fringes. Such techniques are not effective when used with the entirely coherent output of solid-state lasers.

From the foregoing, it will be recognized that there is a need for an illumination system and method that overcomes these drawbacks by providing (1) uniform illumination in the deep ultra-violet range without speckles or fringes, (2) a reliable system that does not require frequent maintenance or service, and (3) a system that does not require use of hazardous materials.

The present invention satisfies this need by providing an illumination system in which a spatially coherent laser beam is transmitted through an array of frequency-shifting cells. Each cell transmits a different segment of the beam, and shifts the frequency of the respective segment by a particular amount that differs from the frequency shift amount generated by any of the other cells. Each frequency-shifted beam segment is transmitted through a short focal-length lens to diverge the beam segment onto a large area overlapping and generally coextensive with the other similarly diverged beam segments.

The fringes generated by overlapping beams sweep across the large area during the course of one laser pulse. This produces a cumulatively uniform illumination, even though at any instant a particular fringe pattern remains. Because the source beam has a small but significant bandwidth, each beam segment is shifted in frequency by a sufficient amount that differs from the frequency shifts of other beam segments to prevent appreciable overlap of the beam segments within the frequency domain. While each beam segment may generate a speckle pattern at the wafer plane, each segment's pattern is unique. Consequently, the overlapping patterns combine without further interference to provide an averaged, uniform illumination.

To reduce the magnitude of frequency shift required, a first group of the beam segments may be polarized in a first direction, and a second group of segments polarized in an orthogonal direction. Consequently, each beam segment need only be frequency-shifted by an amount necessary to avoid frequency domain overlap with those beam segments of the same polarity, and may tolerate frequency domain overlap with beam segments of orthogonal polarity.

The foregoing and additional features and advantages of the present invention will be more readily apparent from the following detailed description, which proceeds with reference to the accompanying drawings.

DETAILED DESCRIPTION OF A PREFERRED EMBODIMENT

Figure 1:
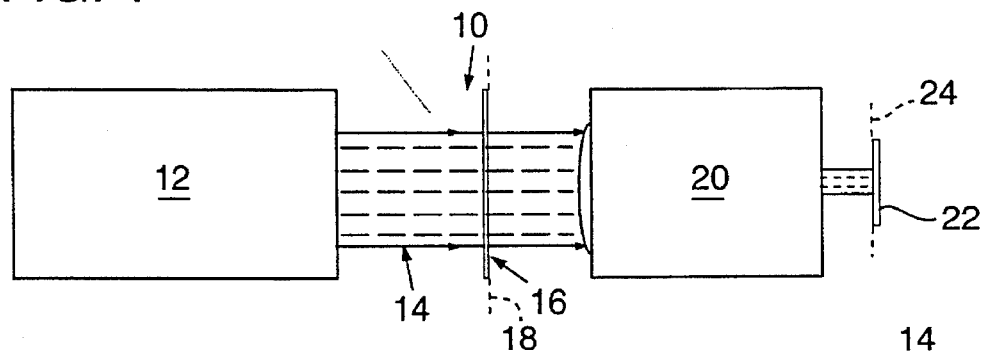
FIG. 1 is a schematic view illustrating an optical microlithography apparatus.

FIG. 1 illustrates an optical microlithography apparatus or "stepper" 10. The stepper includes a light source 12 that generates an output beam 14 consisting of uniformly distributed, substantially parallel rays of light within a narrow range of frequencies. The beam 14 passes through a mask 16, which is a plate having transparent and opaque regions defining an image, and which resides in a mask plane 18. A reduction lens 20 receives light transmitted by the mask, and projects a reduced image of the mask onto a semiconductor wafer 22. The front surface of the wafer on which the image is projected resides in a wafer plane 24. Normally, the stepper 10 is arranged vertically so that light travels downward from the light source toward a horizontally oriented wafer.

Figure 2:
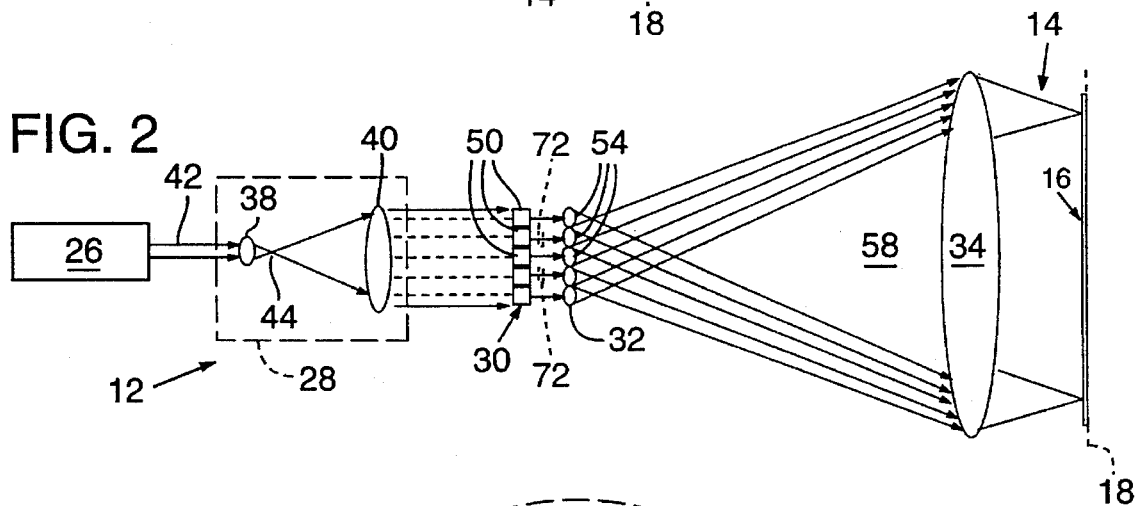
FIG. 2 is a schematic view illustrating an optical microlithography light source according to the present invention.

FIG. 2 illustrates the internal details of a preferred embodiment of the light source 12 of FIG. 1. The light source includes a laser 26, which emits a beam sequentially through a beam expander 28, an array 30 of frequency-shifting Bragg cells, a "fly's eye" array 32 of short focal-length lenses registered with the Bragg cell array 30, and a condenser lens 34, generating uniform illumination of the mask plane 18. The beam follows a beam path that includes all branches and subpaths, including parallel and serially separate beam segments.

The laser 26 is preferably a solid-state laser capable of emitting light in the deep ultra-violet (DUV) wavelength range of 150 to 300 nanometers. While not visible light, DUV radiation will be referred to herein as "light". Such a laser generates a narrow, substantially parallel beam on the order of four millimeters in diameter, and which is spatially coherent across the entire beam diameter. To enlarge the beam diameter without appreciably changing other beam properties, the beam expander 28 employs a short focal-length lens 38 and a long focal-length lens 40. In this case, the short focal-length lens focuses the parallel rays of the beam 42 onto a focal point 44. The long focal-length lens 40 is positioned with its focal point at point 44 so that the rays of a resulting expanded beam 46 are parallel or collimated. In the preferred embodiment, the expanded beam is at least about 50 millimeters in diameter.

Figure 3:
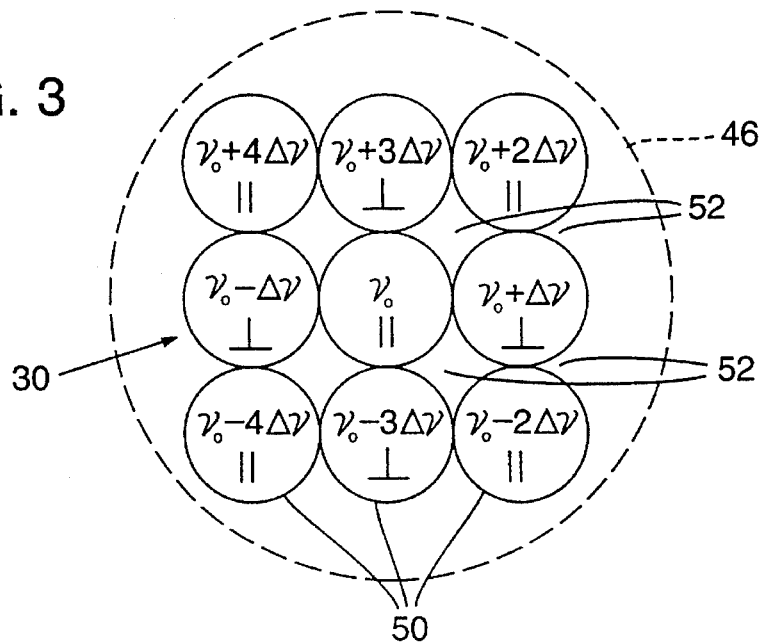
FIG. 3 is a schematic axial view of a frequency-shifting cell array of the embodiment of FIG. 2.

The expanded beam 46 falls upon the Bragg cell array 30, which is entirely circumscribed by the limits of the beam 46 so that each cell is fully illuminated. As shown in FIG. 3, the Bragg cell array 30 comprises a three-by-three matrix of Bragg cells 50. Each cell may comprise one or more Bragg cell units (not shown), with multiple-unit cells being formed by a stack of units so that light passes serially through the units in an individual cell. Typically, many of the units in the array will be capable of the same unit frequency shift; the shift of each cell will be an integral multiple of this amount depending on the number of units in the cell. FIG. 2 shows a row of 5 cells for illustration only; the preferred embodiment is as shown in FIG. 3.

A Bragg cell unit is an Acousto-Optical Modulator that comprises a transparent crystal, such as quartz, fused silica, or lithium fluoride, to which a radio frequency voltage is applied. In response to the radio frequency voltage, and owing to the piezo-electric effect, the crystal forms parallel waves that propagate through the crystal at the speed of sound within the crystal. These waves consist of zones of higher-density compression and lower-density rarefaction in alternating layers. In suitable crystalline materials, the index of refraction is a function of the density of the material. When light enters the Bragg cell at an angle only slightly offset from parallel to the planar density waves within the crystal, the light responds as though it were passing through a transversely moving diffraction grating. Depending on the direction by which the incident beam is offset from the planar waves, the resulting output has a frequency that is either greater than or less than the input frequency by the amount of the radio frequency of the voltage applied to the crystal.

The Bragg cells 50 of FIG. 3 are labeled to indicate the output frequency of each cell. The input frequency is symbolized by $v_0$; the unit frequency shift is given by $\Delta v$. Consequently, the resulting frequency is given by $v=v_0+N\Delta v$, where N equals the number of Bragg cell units in the Bragg cell. The central cell of the array may be considered a "Bragg cell" having zero Bragg cell units, providing a frequency shift of zero. In practice, a central cell would be provided by a transparent region. The interstitial and peripheral regions 52 are blocked to prevent the transmission of light, except through the identified cells.

The fly's eye array 32 comprises an array of short focal-length lens elements 54 arranged so that each element is registered in a one-to-one relationship with a corresponding Bragg cell 50. Each fly's eye lens element 54 disperses the entire output of the respective Bragg cell 50. The center-to-center spacing of the Bragg cells and of the fly's eye lens elements 54 is about one centimeter. At far-field distances substantially greater than the diameter or focal length of a fly's eye lens element 54, an overlap zone 58 is formed in which light is contributed by each of the Bragg cells 50 and lens elements 54. The condenser lens 34 is positioned largely within the overlap zone 58, and is spaced apart from the fly's eye array by a distance equal to the sum of the condenser lens' focal length and a fly's eye element's focal length. Consequently, the condenser lens causes the output of each fly's eye lens element to overlap in the reticle plane 16.

The original laser beam 42 and expanded beam 46 may be gaussian in nature, that is, having an intensity distribution that drops off radially away from the center of the beam. The sampling and spreading of beam segments by the apparatus of FIG. 2 prevents this effect from creating large-scale macroscopic non-uniformities in the mask plane 18. Essentially, each Bragg cell 50 takes an independent separate segment of the expanded beam 46. The central beam segment will tend to have the highest intensity; the peripheral segments will tend to have lower intensities. When the beam segments are recombined in the overlap zone 58 in the mask plane 18, these macroscopic intensity variations are eliminated by averaging. More importantly, the different frequency shifts of the various Bragg cells avoid optical interference between the spatially overlapping combined beam segments. Such interference would create optical fringe patterns that would otherwise render the light source 12 useless for photo microlithography.

Figure 4:
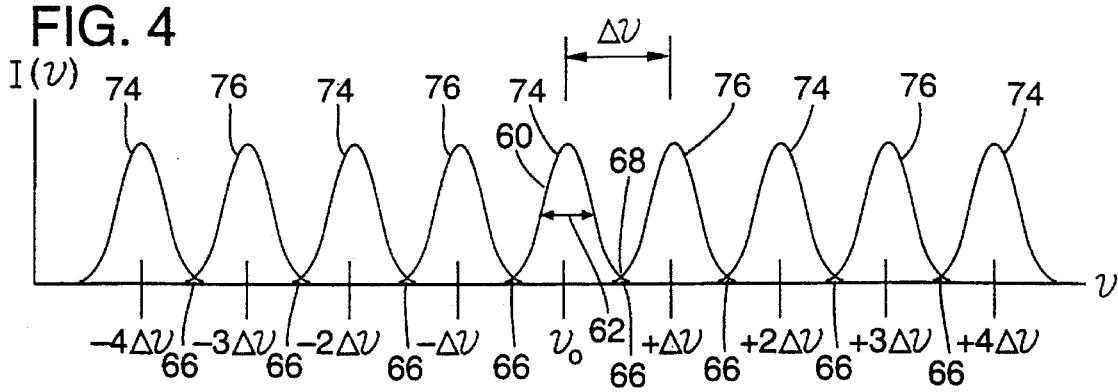
FIG. 4 is a graph showing the frequency distribution of the output of the apparatus of FIG. 2.

FIG. 4 illustrates the frequency distribution of the output beam 14 in the mask plane 18 of the apparatus of FIG. 2. The graph shows nine overlapping beam segment frequency envelopes 74, 76. The central envelope or curve 60 represents the frequency distribution of the unshifted beam segment, which has frequency $v_0$. Although shaped somewhat as a bell curve, the frequency distribution may also be characterized by the curve's band width 62 at an intensity of half the maximum intensity. For solid-state lasers such as employed in the preferred embodiment of the invention, the nominal half-maximum frequency bandwidth 62 is about 100 MHz. Because the frequency shifting of the other beam segments does not change the frequency bandwidth of the segments, the other curves are the same shape as the center curve 60.

In FIG. 4, the smallest unit shift amount is equal to $\Delta v$. This is the frequency shift of a Bragg cell having only a single Bragg cell unit. Each beam segment is shifted by an integral multiple of the unit shift amount, and none of the beam segments is shifted by the same integral multiple in the same positive or negative direction. Consequently, the frequency distribution of the FIG. 2 embodiment comprises an array of nine separate, evenly spaced curves.

In the illustrated embodiment, the unit shift amount $\Delta v$ is 200 MHz. As a result, the overlap between beam segments that are adjacent within the frequency domain is a small but measurable amount indicated by overlap regions 66, where only the tails of adjacent curves overlap. In this portion of the frequency domain, a small amount of light is being contributed by two different beam segments. Within this overlapping frequency range, interference between the two light sources of the same frequency may generate slight fringe patterns. However, because the magnitude of the light that is susceptible to interference is small in comparison to the magnitude of the non-overlapping and non-interfering portions of the beam segments, the fringes are kept within acceptable levels. In the illustrated embodiment, the intensity magnitude at the intersection point 68 is about 6.2% of the maximum intensity at the peak of the curves. The resulting fringes in the mask plane are calculated to have a visibility equal to 10%. The visibility of resulting fringes may be increased, decreased, or entirely eliminated by adjusting the unit shift amount $\Delta v$ to increase, decrease, or eliminate the overlap between beam segments that are adjacent in the frequency domain.

Because Bragg cells decrease in diffraction efficiency as the amount of shift increases, it is desirable to avoid frequency-shifting the beam segments any more than is necessary. In addition, there is generally a higher cost associated with Bragg cells having a higher frequency shift capability. In the ideal case, a Bragg cell would have a frequency shift amount just sufficient to avoid all overlap of frequency output of adjacent beam segments. Excessive frequency shift may, when taken to extremes, result in a total beam bandwidth that exceeds specifications intended to avoid chromatic aberration of the projection lens.

To avoid the need for large-frequency shift amounts, and/or to reduce or eliminate the fringe-generating overlap between adjacent segments, the polarity of some segments may be rotated 90 degrees to avoid interference with other segments. Polarized light does not interfere with orthogonally polarized light. As shown in FIG. 2 in dashed lines, a number of half-wave plates 72 may optionally be placed in some of the beam segments to shift the polarity of those segments. Because the laser light is inherently polarized, the half-wave plates serve to orthogonally polarize the light passing through. As shown in FIG. 3, the unshifted beam segment $v_0$ and the segments shifted by $+2\Delta v$, $+4\Delta v$, $-2\Delta v$, and $-4\Delta v$, are labeled as having parallel polarization inherent to the laser 26. These are considered the even beam segments 74, as labeled in FIG. 4. The remaining beam segments shifted by $+\Delta v$, $+3\Delta v$, $-\Delta v$, and $-3\Delta v$ are labeled as the "odd" segments 76. With the half-wave plates in place as illustrated in FIGS. 2 and 3, the overlap regions 66 no longer generate interference fringes. Consequently, employing this polarization principle, the apparatus of FIG. 2 would be entirely without interference fringes.

Figure 5:
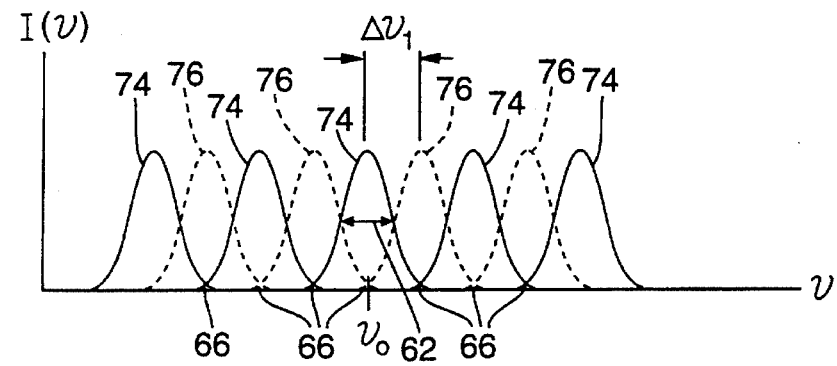
FIG. 5 is a graph showing the frequency distribution of an alternative embodiment of the apparatus of FIG. 2.

FIG. 5 illustrates the frequency distribution of an embodiment similar to that of FIG. 2, employing half-wave plates to obtain the benefits of the polarization principle, but having a unit frequency shift amount $\Delta v_1$ that is half that of the embodiment graphed in FIG. 4. In this case, $\Delta v_1$ is approximately equal to the frequency bandwidth 62 at one-half the maximum intensity. The perpendicular polarized even segments 74 are illustrated in solid lines, and the parallel-polarized odd segments 76 are illustrated in dashed lines. Here, the benefits of the polarization principle are employed to reduce the unit shift amount, while tolerating the small fringe visibility resulting from the overlap regions 66.

Figure 6:
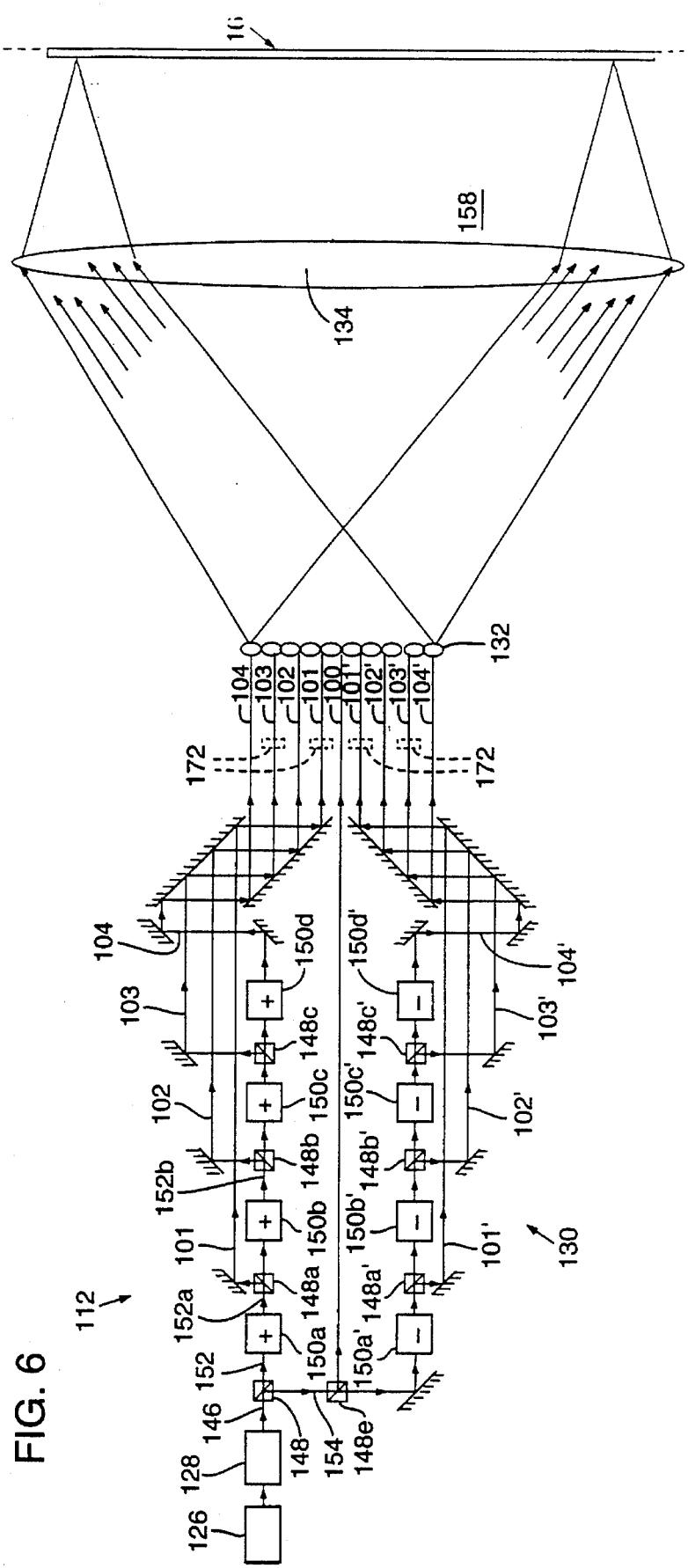
FIG. 6 is a schematic view illustrating a second embodiment of the invention.

FIG. 6 illustrates a second embodiment light source 112 that employs beam splitters to break up the original laser beam into a branching path of beam segments. The beam segments pass through a series of Bragg cells arranged in tandem to reduce the number of cells required. In this embodiment, each cell includes only a single Bragg cell unit of the same unit frequency shift. For comparison, the embodiment illustrated at FIG. 3 requires up to 20 Bragg cells having a unit shift amount of $\Delta v$. In the FIG. 6 embodiment, on the other hand, this quantity is reduced to eight. The light source 112 includes a deep-ultra-violet-emitting solid-state laser 126, which sends a beam through a beam homogenizer 128, which converts the beam from one that is substantially gaussian in intensity across its beam diameter, to one that has a nearly flat intensity across its diameter. This may be achieved through such conventional means as an internally reflective elongated conduit, fly's eye lens arrays, and/or prisms for "folding" portions of the beam to redistribute the segments thereof, or by beam apodization.

The resulting homogenized beam 146 is a narrow, spatially coherent beam, and is transmitted into a beam processor 130 to generate a plurality of beam segments. In the embodiment of FIG. 2, each beam segment is a spatially distinct portion of the beam, sectioned in parallel with the other segments. In the FIG. 6 apparatus each beam segment is formed by splitting a fractional portion of the entire beam's flux using a beam splitter 148. Each beam segment contains a portion of the flux from across the entire beam diameter. Typical beam splitters employ a semi-silvered surface that reflects a portion of an incident beam and transmits the remainder.

The beam segments of FIG. 6 are labeled as: an unshifted segment 100 having a frequency of $v_0$, positively shifted segments 101, 102, 103 and 104, having positively shifted frequencies of $v_0+\Delta v$, $+2\Delta v$, $+3\Delta v$, and $+4\Delta v$, respectively, and negatively shifted segments 101', 102', 103', 104', having shifted frequencies of $v_0-\Delta v$, $-2\Delta v$, $-3\Delta v$, and $-4\Delta v$, respectively.

In the FIG. 6 embodiment, the homogenized beam 146 encounters a first beam splitter 148 that transmits a first beam portion 152 and deflects a second beam portion 154. The first beam portion 152 passes through a first Bragg cell 150a, which positively shifts the frequency of the first beam portion by unit frequency shift $\Delta v$. The shifted first beam portion 152a encounters beam splitter 148a, which deflects the once-shifted beam segment 101 and transmits the remainder to Bragg cell 150b, which in turn emits a further-shifted first beam portion 152b through beam splitter 148b. Beam splitter 148b deflects the twice-shifted beam segment 102 and transmits the remainder, with Bragg cell 150c providing an additional shift. Beam splitter 148c deflects the thrice-shifted beam segment 103 and transmits the remainder through Bragg cell 150d, which yields the four-times shifted beam segment 104.

The as-yet-unshifted second beam portion 154 that is deflected by the first beam splitter 148, encounters beam splitter 148e, which deflects the unshifted beam segment 100. The beam splitter 148e also transmits the remainder to an arrangement of Bragg cells and beam splitters that function similarly to the array discussed above for generating the positively shifted beam segments 101 through 104, except that each of Bragg cells 150a'; 150b', 150c', and 150d' provides an incremental negative frequency shift. Thus, the once-shifted beam segment 101' is split off after the second beam portion 154 passes through the first cell, segment 102' is split after the second cell, segment 103' is split after the third cell, and segment 104' results after passing through four cells.

An arrangement of mirrors is indicated to direct the beam segments into a parallel bundle toward a fly's eye lens array 132, with each lens element dispersing the light from a single corresponding beam segment. Although the mirrors and beam splitters are illustrated as maintaining the beam segments in a single plane, the paths may be "folded" out of this plane with additional mirrors to avoid obstacles, and to permit the use of a more compact fly's eye array than the illustrated elongated linear array. The dispersed beams overlap in the region 158 of a condenser lens 134. The collimated beam is projected onto the mask or reticle 16 in the manner of the embodiment of FIG. 2.

In the embodiment of FIG. 6, the nine beam segments are equal in intensity as they approach the lens array 132. To achieve this, the reflectivity and transmissivity of each beam splitter must be calculated to compensate for the efficiency loss at each Bragg cell, and at all other optical surfaces. The illustrated embodiment may optionally include half-wave plates 172 to orthogonally polarize beam segments 101, 101', 103, and 103', to achieve the results discussed above with respect to FIG. 2. Without the half-wave plates 172, the output of the FIG. 6 embodiment is as illustrated at FIG. 4. With the half-wave plates 172 inserted in the proper alternate beam paths, and with the frequency by which each Bragg cell shifts transmitted light being reduced to Δv, a distribution of frequencies as shown in FIG. 5 will result.

Figure 7:
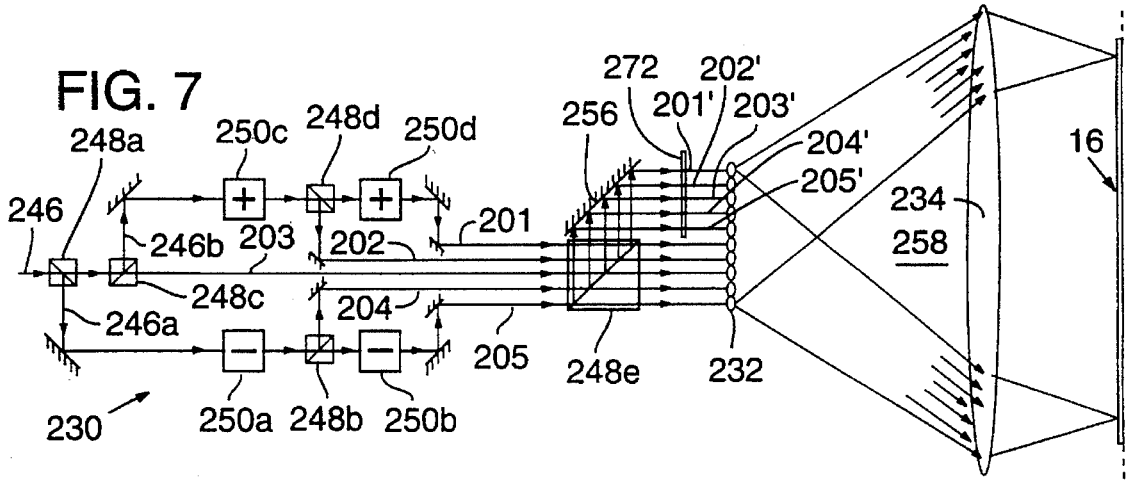
FIG. 7 is a schematic view illustrating a third embodiment of the invention.

FIG. 7 illustrates an alternative beam processing apparatus 230 generally employing the tandem Bragg cell and beam splitter concept of FIG. 6, and the polarization principle. The embodiment provides ten beam segments without appreciable interference fringe-generating overlap of frequencies, and requires only four Bragg cells. The illustrated embodiment receives a homogenized laser beam 246, splits the beam into five beam segments 201, 202, 203, 204 and 205. Two of the segments are positively frequency-shifted by different amounts, two are negatively shifted by different amounts, and one remains unshifted. The bundle of five is subsequently split to create a second bundle of five that is then orthogonally polarized. All segments are then recombined to provide uniform overlapping illumination.

A first beam splitter 248a diverts a first beam portion 246a toward a Bragg cell 250a, which negatively shifts the beam portion by Δv. The resulting shifted beam encounters a beam splitter 248b, which diverts beam segment 204, and transmits the remainder of the beam portion 246 through Bragg cell 250b, generating negatively twice-shifted beam segment 205.

The portion of the incident beam 246 that is transmitted through the beam splitter 248a encounters beam splitter 248c, which transmits an unshifted beam segment 203, and which deflects a second beam portion 246b. This deflected portion 246b is positively shifted by Bragg cell 250c, with beam splitter 248d deflecting once-shifted beam segment 202 and transmitting the remainder to Bragg cell 250d, generating twice-shifted beam segment 201.

Figure 8:
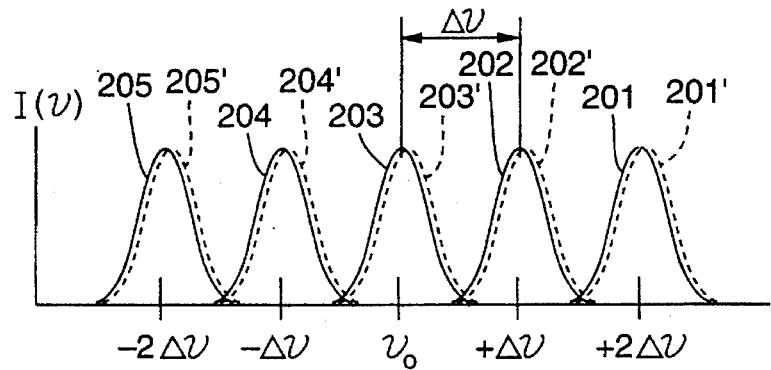
FIG. 8 is a graph showing the frequency distribution of the embodiment of FIG. 7.

Beam segments 201 through 205 comprise a bundle of segments that do not substantially overlap in the frequency domain, as shown in FIG. 8, thereby avoiding anything more than minimal fringe-generating interference. The bundle encounters a beam splitter 248e, which transmits half the flux of each segment and deflects the other half. An angled mirror 256 reflects the deflected bundle through a half-wave plate 272, generating orthogonally polarized beam segments 201' through 205'. Each of the resulting ten beam segments is diverged by an element of a fly's eye array 232. The diverging beam segments are collected by a condenser lens 234, in the manner of the previously discussed embodiments, to generate the overlap region at 16.

FIG. 8 represents the output of the apparatus of FIG. 7, with each curve labeled to indicate the corresponding beam segment. Essentially, FIG. 8 shows a first set of beam segments 201 through 205 that do not substantially overlap in the frequency domain, and a second set of beam segments 201' through 205' that do not substantially overlap with each other, but each of which entirely overlaps a corresponding beam segment that did not pass through the half-wave plate 272. Because two beams of orthogonally polarized light of the same frequency do not generate interference fringes, the perfectly overlapping curves do not create a problem.

By maximizing the number of beam segments, the speckle and interference fringes generated by any one beam segment is minimized, as the speckle patterns of the various segments are unique, and tend to cancel each other without interference. By using two unshifted beam segments of orthogonal polarity, by employing a tandem arrangement of Bragg cells, and by employing the polarity principle in the shifted beam segments, transmission efficiency is improved, parts costs are reduced, and complexity is minimized.

Figure 9:
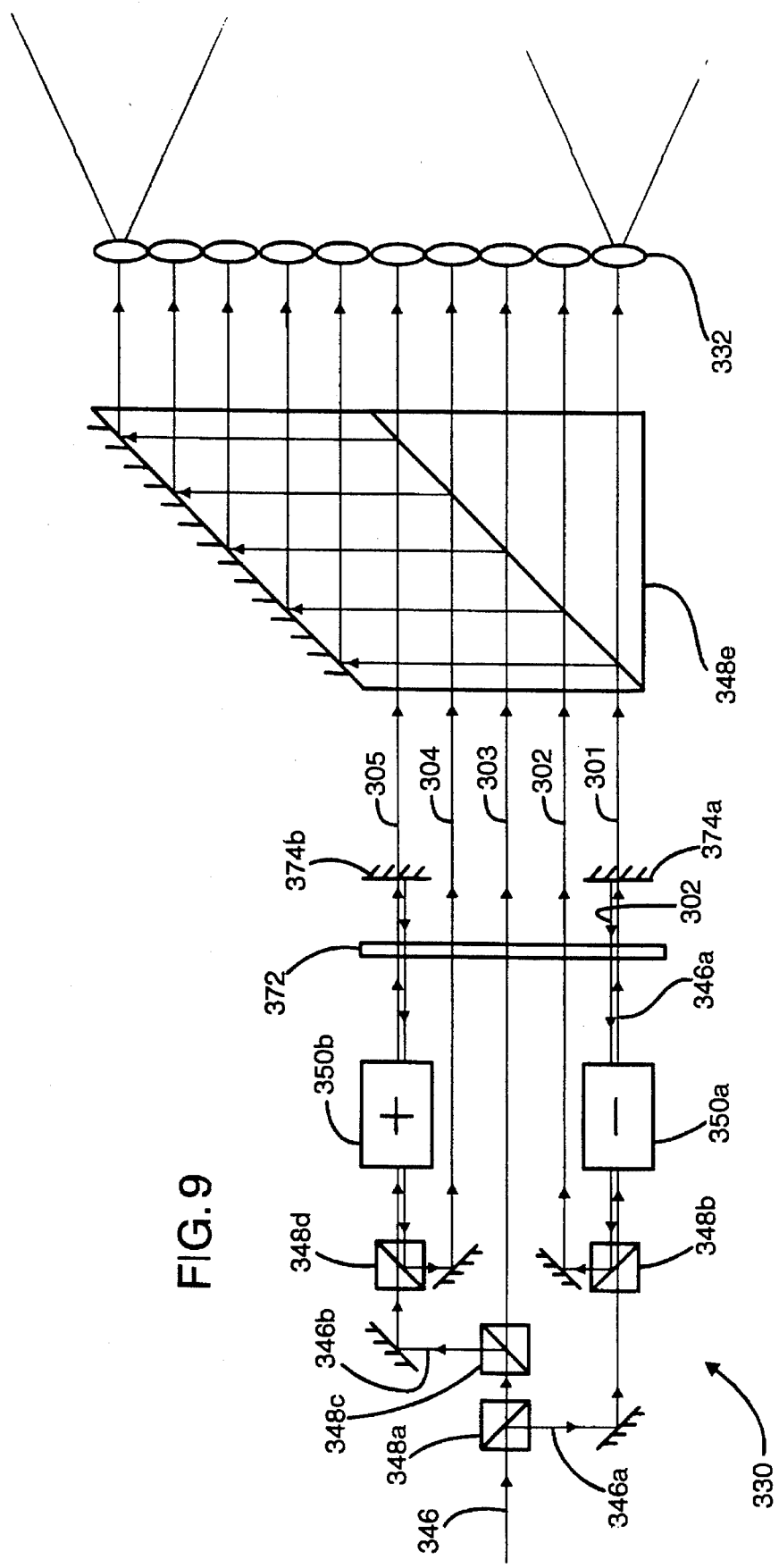
FIG. 9 is a schematic view illustrating a fourth embodiment of the invention.

FIG. 9 illustrates a further alternative beam processing apparatus 330 employing the polarization principle and retrograde passage of beam segments to provide ten substantially non-interfering beam segments with only two Bragg cell units. This is believed to be the most cost-effective embodiment. As with the FIG. 7 embodiment, the FIG. 9 embodiment receives a homogenized laser beam 346, splits the beam into five beam segments 301, 302, 303, 304 and 305. Beam 346 is assumed to be polarized parallel to the plane of incidence. Two of the segments are positively frequency-shifted by different amounts, two are negatively shifted by different amounts, and one remains unshifted. The bundle of five is subsequently split to create a second bundle of five that is then orthogonally polarized. All segments are then recombined to provide uniform overlapping illumination.

A first beam splitter 348a diverts a first beam portion 346a toward a polarizing beam splitter 348b. A polarizing beam splitter (PBS) transmits all light of one polarity and deflects light of orthogonal polarity. In this discussion, it will be arbitrarily assumed that all such PBS units transmit parallel-polarized light and deflect perpendicularly polarized light. Unlike a conventional semi-silvered beam splitter, an ideal PBS does not suffer an appreciable light loss when transmitting or deflecting appropriately polarized light.

The polarizing beam splitter 348b transmits the parallel-polarized beam 346a to Bragg cell 350a, which negatively shifts the beam portion by $\Delta v$. The resulting shifted beam encounters a quarter-wave plate 372, which circularly polarizes the incident parallel-polarized beam portion 346a. The transmitted beam portion then encounters a partially reflecting mirror 374a oriented substantially perpendicular to the beam portion. The mirror 374a transmits beam portion 301, and reflects beam portion 302 back through the quarter-wave plate 372, through the Bragg cell 350a, toward the polarizing beam splitter 348b. The quarter-wave plate converts the circularly polarized beam segment 302 to perpendicular polarity. The Bragg cell provides a second frequency shift, and the polarizing beam splitter 348b deflects substantially all of the perpendicularly polarized beam segment 302, which is reflected back through the quarter-wave plate 372 to generate a circularly polarized resulting beam segment.

The portion of the incident beam 346 that is transmitted through the beam splitter 348a encounters beam splitter 348c, which transmits an unshifted beam segment 303, and which deflects a second beam portion 346b. This deflected portion 346b is processed in the same manner as is segment 346a, except that Bragg cell 350b provides a positive frequency shift. Beam segment 305 is once positively shifted; segment 304 is twice shifted. All of the resulting beam segments are circularly polarized when they encounter a polarizing beam splitter 348e. Splitter 348e transmits the parallel-polarized components of the bundle of beam segments, and deflects the perpendicularly polarized components. The resulting transmitted and deflected components are directed toward respective elements of a fly's eye lens array 332, which diverges the segment components onto a condenser lens at the mask plane as shown in FIG. 7. The resulting frequency distribution is equivalent to that illustrated in FIG. 8.

In the preferred embodiment, the laser 26 may be a frequency-converted Yttrium-Aluminum-Garnet (YAG) laser, a frequency-tripled Titanium-Sapphire laser, or any other light source emitting energy in the desired wavelength range. Although not currently available, it would be desirable to apply the principles of the invention to light having output at shorter than DUV wavelengths. The principles of the invention may be applied to non-solid state lasers, and to coherent non-laser light sources, although solid state lasers presently enjoy the advantages discussed above. The preferred laser has a power output in the range of 8–10 watts of average power. Suitable Bragg cells may be obtained from Neos Technology of Melbourne, Florida, and are capable of achieving reasonable diffraction efficiencies of 80% at frequency shifts of 50 to 300 megahertz. The wavelength bandwidth specification of the projection lens is such that a wide range of large frequency shifts and/or large numbers of beam segments is possible.

It will be apparent to those skilled in the art that the illustrated embodiments may be modified without departing from such principles. The invention is claimed not only as the illustrated embodiments, but all such modifications, variations and equivalents thereof as come within the true spirit and scope of the following claims.

I claim:

1. An illumination apparatus for illuminating a mask in a photo microlithography stepper comprising:

a laser emitting a beam along a beam path;

an array of frequency-shifting cells positioned within the beam path, each cell being operable to intercept, frequency-shift, and transmit along the beam path a respective separate beam segment portion of the beam, at least some of the cells being capable of frequency shifting by different shift amounts;

a beam segment integrator positioned within the beam path for recombining the beam segments to overlap the beam segments to illuminate the mask.

2. The apparatus of claim 1 wherein the beam segment integrator comprises an array of beam-spreading lenses positioned within the beam path, each lens corresponding to a respective frequency-shifting cell, transmitting the same beam segment as said cell, and projecting said beam segment onto an entire mask region, such that each portion of the mask region is illuminated by each beam segment.

3. The apparatus of claim 2 wherein the beam spreading lenses are arranged side-by-side at substantially the same position along the beam path in a fly's eye array to intercept adjacent portions of the beam.

4. The apparatus of claim 1 wherein each frequency-shifting cell is operable to shift the frequency of the respective transmitted segment by a unique amount different from the other cells, such that the mask is not illuminated by two recombined beam segments having identical properties.

5. The apparatus of claim 4 wherein the cells generate a distribution of resulting frequencies evenly distributed within a frequency domain, each resulting frequency differing from the other resulting frequencies by an integral multiple of a unit frequency shift amount.

6. The apparatus of claim 4 including a polarization assembly positioned in the beam path to transmit a first portion of each beam segment without changing polarization, and to change the polarization of a second portion of each beam segment to a second polarization different from that of the first portion.

7. The apparatus of claim 6 wherein the polarization assembly includes a half-wave plate.

8. The apparatus of claim 4 including a polarizer positioned in the beam path to intercept and change the polarization of at least some, but not all of the beam segments.

9. The apparatus of claim 6 wherein the polarization assembly is positioned to intercept only alternating beam segments as distributed within a frequency domain, such that segments that are adjacent in the frequency domain have different polarities.

10. The apparatus of claim 4 wherein at least one of the beam segments has an unchanged frequency.

11. The apparatus of claim 1 including a beam expander positioned in the beam path for expanding the beam diameter to circumscribe the array of frequency-shifting cells such that each cell is illuminated by the beam.

12. The apparatus of claim 1 including a condenser lens positioned in the beam path between the beam segment integrator and the mask to provide substantially collimated illumination of the mask.

13. The apparatus of claim 1 including at least one beam splitter in the beam path to provide a branching beam path comprising a plurality of separate beam portions, each beam portion being directed to at least one frequency-shifting cell that is distinct from the cell to which the other portion is directed, such that each beam portion may be differently shifted.

14. An illumination apparatus for illuminating a mask in a photo microlithography stepper comprising:

a laser emitting an incident beam along a beam path;

a beam splitter positioned in the beam path to receive the incident beam, to transmit a first beam portion, and to deflect a second beam portion, the first and second beam portions comprising first and second beam path branches of the beam path;

a first frequency-shifting cell positioned within the first beam path branch to intercept, frequency-shift, and transmit the first beam portion, such that the first and second beam portion have different frequencies; and a beam segment integrator positioned within the beam path and operable to direct at least part of each of the first beam portion and of the second beam portion toward a common plane, such that the common plane is illuminated by both beam portions.

15. The apparatus of claim 14 wherein the recombining means comprises an array of beam-spreading lenses positioned within the beam path, each lens positioned to transmit a single beam portion and to project said portion onto the common plane, such that each portion of the common plane is illuminated by each separate portion of the beam.

16. The apparatus of claim 14 including a second beam splitter positioned within the first beam path branch downstream of the first cell to transmit a third beam portion and to deflect a fourth beam portion, the third and fourth beam portions comprising third and fourth beam path branches; and a second frequency-shifting cell positioned within the third beam path branch to intercept, frequency-shift, and transmit the third beam portion, such that the fourth beam portion is shifted by the first cell, and the third beam portion is shifted both by the first cell and by the second cell.

17. The apparatus of claim 14 including a polarization element positioned within the beam path, such that light passing therethrough is given a different polarization.

18. The apparatus of claim 17 wherein the polarization assembly includes a beam splitter.

19. The apparatus of claim 17 wherein the polarization element includes a half-wave plate.

20. The apparatus of claim 14 including a beam homogenizer positioned in the beam path for increasing the uniformity of intensity of the incident beam across the beam diameter.

21. An illumination apparatus comprising:

a laser emitting a beam having an initial frequency;

shifting means for shifting the initial frequency of at least part of the beam to provide a resulting beam having a first portion with a first frequency and a second portion with a different second frequency; and recombining means for projecting the first portion and the second portion onto a common zone, such that the common zone is illuminated both by the first portion and by the second portion.

22. The apparatus of claim 21 including polarization means for changing the polarity of at least part of at least one of the first and second beam portions, such that the common zone is illuminated by light of different polarities.

23. The apparatus of claim 22 wherein the polarization means comprises a fractional-wave plate selected from a group comprising a half-wave plate and a quarter-wave plate.

24. The apparatus of claim 21 wherein the polarization means includes a beam splitter in the beam path for splitting the beam into a first bundle to be polarity-changed, and a second bundle to have unchanged polarity.

25. The apparatus of claim 21 wherein the shifting means includes a plurality of adjacent frequency-shifting cells.

26. The apparatus of claim 21 wherein the shifting means includes a plurality of beam splitters positioned in the beam path to split the beam path into a plurality of branches.

27. The apparatus of claim 26 wherein the shifting means includes a plurality of frequency-shifting cells, with a first cell being positioned in the beam path upstream of a selected beam splitter, and a second cell being positioned in the beam path downstream of the selected beam splitter, such that a first portion of the beam is shifted only by the first cell, and a second portion of the beam is shifted both by the first cell and by the second cell.

28. The apparatus of claim 21 wherein the recombining means includes a plurality of lenses, a first lens being positioned to intercept the first portion of the beam, and a second lens positioned in the beam path to intercept the second portion of the beam.

29. A method of uniformly illuminating a mask plane with a laser emitting a beam comprising the steps:

separating the beam into a plurality of beam segments;

shifting the frequency of at least some of the beam segments;

projecting each of the beam segments onto the mask plane.

30. The method of claim 29 including the step of changing the polarity of at least some of the beam segments.

31. The method of claim 29 wherein the step of separating the beam into a plurality of segments includes passing the beam through a beam splitter.

32. The method of claim 29 wherein the step of shifting the frequency includes increasing the frequency of at least a first segment, decreasing the frequency of at least a second segment, and transmitting a third segment with an unchanged frequency.

33. The method of claim 32 including changing the polarity of a first portion of each of the first, second, and third segments, and transmitting a second portion of each of the first, second, and third segments without a polarity change, such that the mask plane is illuminated by at least six segments having different frequency or polarity properties.

* * * * *